United States Patent [19]

Tatyrek et al.

[11] Patent Number: 5,879,468
[45] Date of Patent: Mar. 9, 1999

[54] METHOD FOR THE REMOVAL OF THERMOSET POTTING COMPOUND FROM THE ELECTRONICS PACKAGE OF A MUNITIONS ITEM

[75] Inventors: Alfred F. Tatyrek, Maplewood, N.J.; Merrill Eig, Encino, Calif.

[73] Assignee: The United States of America as represented by the Secretary of the Army, Washington, D.C.

[21] Appl. No.: 161,179

[22] Filed: Sep. 25, 1998

Related U.S. Application Data

[63] Continuation of Ser. No. 858,194, Apr. 21, 1997, abandoned.

[60] Provisional application No. 60/016,767 May 2, 1996.

[51] Int. Cl.⁶ ........................................ B08B 3/08
[52] U.S. Cl. ........................................ 134/21; 134/22.18
[58] Field of Search .................................. 134/21, 22.18, 134/34, 37, 38

[56] References Cited

U.S. PATENT DOCUMENTS

| 3,706,691 | 12/1972 | Duffy et al. | 134/38 |
|---|---|---|---|
| 4,699,667 | 10/1987 | Walsh | 134/12 |
| 5,154,197 | 10/1992 | Auld et al. | 134/1 |
| 5,178,788 | 1/1993 | Marquis et al. | 134/38 |
| 5,298,081 | 3/1994 | Marquis | 134/38 |
| 5,514,300 | 5/1996 | Mlasblom | 252/542 |

OTHER PUBLICATIONS

Tatyrek, A.F., Memorandum Report ARAED–MR–94001, "Method for the Removal of Thermoset Potting Compound from the Electronics Package of a Munitions Item", May 1995.

Primary Examiner—Jeffrey Snay
Attorney, Agent, or Firm—John F. Moran

[57] ABSTRACT

A method was developed for the nondestructive removal of thermoset foamed potting material from the electronics package of components in ammunition. The ultimate objective in this effort was to perform a systems technical analysis of the electronic guidance and fuse systems. This was being done in order to determine the electronic components used, the engineering design, functional circuitry, and overall performance of the ammunition.

1 Claim, No Drawings

METHOD FOR THE REMOVAL OF THERMOSET POTTING COMPOUND FROM THE ELECTRONICS PACKAGE OF A MUNITIONS ITEM

This application is a continuation of application Ser. No. 08/858,194, filed Apr. 21, 1997, now abandoned, which is a continuation-in-part of Provisional Application No. 60/016,747, filed May 2, 1996.

GOVERNMENTAL INTEREST

The invention described herein may be manufactured, used and licensed by the Government for Governmental purposes.

BACKGROUND OF THE INVENTION

There has been a need for a method for the removal of cured thermoset polyurethane foamed potting material from multitiered electronics packages in ammunition (EP package). The objective is to perform a technical analysis of the electronic guidance and fuse systems used for the ammunition. This is done in order to determine the electronic components, the engineering, functional circuitry and overall performance of the ammunition.

Before the electronics analysis can be performed, a method is needed to remove the solid thermoset foamed polyurethane polymer (potting material) in which the individual electronic systems were encased. Being thermoset, the cured polymer was very hard and unaffected by most common polar and nonpolar organic solvents.

Concentrated and fuming sulfuric acid materials did readily attack and dissolve the polymer but left an acid residue which was both dangerous and corrosive to many of the electronic components. In addition, the printed identification on the individual components was often removed or rendered illegible.

SUMMARY OF THE INVENTION

It was found that a highly polar solvent, N-methyl-2-pyrrolidone, was able to significantly soften and weaken the cured resin material without visibly effecting the encased electronic components. N-methyl, 2-pyrrolidone is a liquid of high boiling point (202° C.) and having a relatively low human toxicity.

DETAILED DESCRIPTION OF THE INVENTION

The following polymer removal procedure was used on an EP package:

1. The EP package was placed into an 1800 $cm^3$ Pyrex beaker and sufficient N-methyl, 2-pyrrolidone was poured into the beaker to submerge two thirds of the EP package. This was then placed into a vacuum chamber equipped with a glass window and evacuated to 30 inch Hg; a significant amount of vapor bubbles were evolved from the EP package during the first 30 minutes under vacuum. This evacuation procedure is considered essential in order to remove as much air and/or other gases as possible from the potted electronics packaged, so that in the next step of the procedure the solvent can readily flow into the empty cells and act on the cured cellular structure from within the electronics package.

2. The chamber was then returned to atmospheric pressure and refilled with atmospheric air to allow the pyrrolidone to flow into the evacuated cells of the foamed potting material. The EP package was held at atmospheric pressure for about 10 minutes.

3. Full vacuum was again applied to the EP package for an additional 1 hour and 15 minutes after which it is brought back to atmospheric pressure for an overnight soak of 18 hours to insure complete internal solvent penetration.

4. After the overnight soak, it was noted that the foamed polyurethane material of the EP package had swelled considerably, had the physical appearance of soft bread crumbs, and fell off very readily. It was also noted that the level of the pyrrolidone had dropped significantly (approximately 25%).

5. The EP package was then removed from the beaker, placed in a pan and returned to the vacuum for 5 minutes to drain off additional residual pyrrolidone solvent. About 30 $cm^3$ of liquid was recovered and filtered for reuse at a later date.

6. The EP package was taken from the vacuum chamber. Removal of the softened foamed material was readily accomplished using a soft paint brush and compressed air. In the tight spaces having many electronic components and wiring, small needle and hook type tools were used.

The United States Government employs a variety of electronics and circuit board components in integral parts of weapon systems, such as guidance, fusing, telemetry, etc. Normally these components are encapsulated or potted with a thermoset material such as polyurethane resin. This encapsulation protects the delicate electronics and enables it to survive the violent setback forces that are experienced during the launching of the particular weapon system in which these components are contained. The high degree of sophistication of these components makes them extremely expensive. To date when a problem arises there is no way of getting into the complex electronics to locate, repair, or replace a defective part or to be able to update an electronics package. Typically, a component can cost thousands of dollars and must be discarded when there is a deficiency with it. If one could get to the particular encapsulated component that is defective, or should be replaced a fix could be installed at a very nominal cost. With relative ease and at low cost, by the practice of this invention, weapon components can now be stripped of their encapsulation without destroying the electronics, or defacing the components or their identifying characteristics.

We claim:

1. A method of removing a cured thermoset polyurethane foamed resin potting and encapsulating an electronics package (EP) having mulitiered electronic circuitry serving as guidance and fusing systems in weapons and ammunition, the method of removing resin providing free accessing for analyzing the EP in original condition, the method comprising:

(a) placing the EP in a closed vessel containing a quantity of a sole component of N-methyl pyrolidone (NMP) submerging two/thirds of the EP in the NMP, (b) exhausting air from the closed vessel to produce a first vacuum and maintaining the vacuum for at least 30 minutes to cause gaseous material to evolve from foamed cells of the cured resin, (c) returning the closed vessel to full atmospheric pressure the NMP to flow into the foamed cells for about 10 minutes, (d) exhausting the closed vessel to produce a second vacuum to evolve gaseous material from the foamed cells of the resin and maintaining the second vacuum for about one hour and fifteen minutes, (e) returning the closed vessel to full atmospheric pressure for a soaking time of eighteen hours to insure complete penetration of the resin by the NMP, (f) removing the NMP from the closed vessel containing the EP, (g) exhausting the closed vessel for about five minutes to drain away residual NMP, (h) removing the EP from the vessel, and (i) physically removing the resin now present as softened foam material using a combination of a soft paint brush, small needles, or small hooked shaped tools with compressed air.

* * * * *